US010126327B2

(12) United States Patent
Morel et al.

(10) Patent No.: US 10,126,327 B2
(45) Date of Patent: Nov. 13, 2018

(54) CURRENT TRANSDUCER

(71) Applicant: LEM INTELLECTUAL PROPERTY SA, Fribourg (CH)

(72) Inventors: Pascal Morel, Saint Pierre en Faucigny (FR); Jean-Marie Vardon, Amancy (FR); Salim Sid, Annemasse (FR)

(73) Assignee: LEM INTELLECTUAL PROPERTY SA, Fribourg (CH)

( * ) Notice: Subject to any disclaimer, the term of this patent is extended or adjusted under 35 U.S.C. 154(b) by 0 days.

(21) Appl. No.: 15/125,700

(22) PCT Filed: Mar. 20, 2015

(86) PCT No.: PCT/EP2015/055973
§ 371 (c)(1),
(2) Date: Sep. 13, 2016

(87) PCT Pub. No.: WO2015/144592
PCT Pub. Date: Oct. 1, 2015

(65) Prior Publication Data
US 2017/0010310 A1 Jan. 12, 2017

(30) Foreign Application Priority Data
Mar. 24, 2014 (EP) .................................. 14161252

(51) Int. Cl.
*G01R 15/20* (2006.01)
*H01R 13/66* (2006.01)
(Continued)

(52) U.S. Cl.
CPC ............. *G01R 1/04* (2013.01); *G01R 15/207* (2013.01); *H01R 12/58* (2013.01);
(Continued)

(58) Field of Classification Search
None
See application file for complete search history.

(56) References Cited

U.S. PATENT DOCUMENTS 3,926,497 A 12/1975 Eigenbrode
5,033,709 A 7/1991 Yuen
(Continued)

FOREIGN PATENT DOCUMENTS

DE 102011017237 12/2011
EP 0072422 2/1983
(Continued)

OTHER PUBLICATIONS

International Search Report and Written Opinion issued by the European Patent Office, dated Aug. 10, 2015, for International Application No. PCT/EP2015/055973; 20 pages.

*Primary Examiner* — Jermele M Hollington
(74) *Attorney, Agent, or Firm* — Faegre Baker Daniels LLP

(57) ABSTRACT

Electrical current transducer for measuring an electric current in a primary conductor, including a housing (4), a magnetic core (6) surrounding a central aperture (9) through which the primary conductor extends, and a magnetic field sensing device (8) comprising connection terminals (18). The housing comprises a magnetic core receiving cavity (22) in which the magnetic core is lodged and a connecting interface portion (25) in which the magnetic field sensing is lodged, the connecting interface projecting outwardly from the magnetic core receiving cavity and comprising latching elements complementary to latching elements of a separate connector interface element (11) selectively mountable to the connecting interface portion. The connector interface element comprises a connector shroud (14) forming with the connection terminals a pluggable connector interface for pluggable connection to an external pluggable connector, the (Continued)

current transducer adapted for mounting on an external circuit board without connector shroud.

16 Claims, 8 Drawing Sheets

(51) Int. Cl.
    *G01R 1/04*    (2006.01)
    *H01R 12/58*   (2011.01)
    *H01R 13/74*   (2006.01)

(52) U.S. Cl.
    CPC ....... *H01R 13/6683* (2013.01); *H01R 13/745* (2013.01); *H01R 2201/20* (2013.01); *H01R 2201/22* (2013.01)

(56) References Cited

U.S. PATENT DOCUMENTS

| | | | |
|---|---|---|---|
| 6,047,936 A | 4/2000 | Favotto | |
| 8,963,009 B2 * | 2/2015 | Leifer | H02G 5/00 174/135 |
| D742,842 S * | 11/2015 | Hayashi | D13/182 |
| D766,180 S * | 9/2016 | Morel | D13/110 |
| D769,190 S * | 10/2016 | Sid | D13/110 |
| D769,817 S * | 10/2016 | Sid | D13/110 |
| 9,726,695 B2 * | 8/2017 | Plagne | G01R 15/183 |
| 9,804,202 B2 * | 10/2017 | Labbe | G01R 15/185 |
| 2008/0290857 A1 * | 11/2008 | Lepine | G01R 15/207 324/117 R |
| 2008/1290857 | 11/2008 | Lepine | |
| 2012/1061414 | 3/2012 | Bundy | |
| 2013/0154629 A1 * | 6/2013 | Gudel | G01R 15/185 324/225 |
| 2015/0070006 A1 * | 3/2015 | Turpin | G01R 15/207 324/244 |

FOREIGN PATENT DOCUMENTS

| | | |
|---|---|---|
| EP | 0702432 | 3/1996 |
| EP | 2423693 | 2/2012 |
| EP | 2660611 | 11/2013 |
| FR | 2664079 | 1/1992 |
| FR | 2936053 | 3/2010 |

* cited by examiner

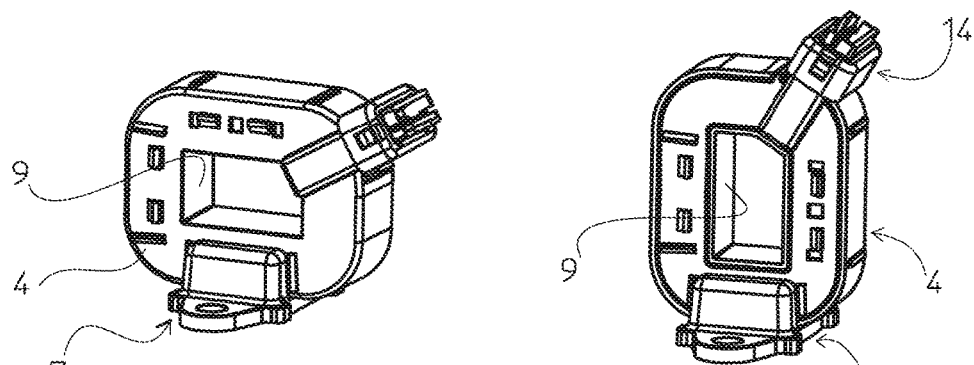
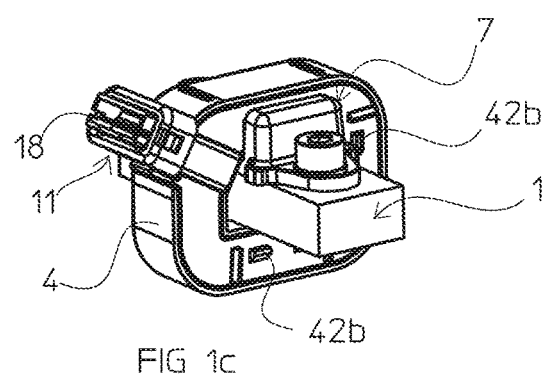
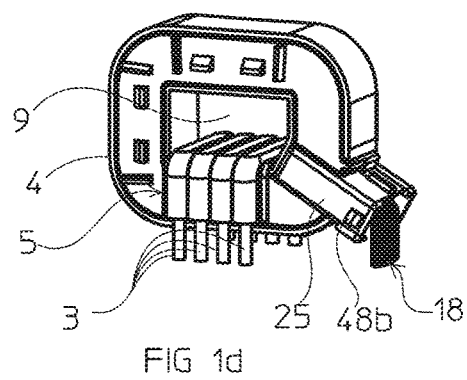
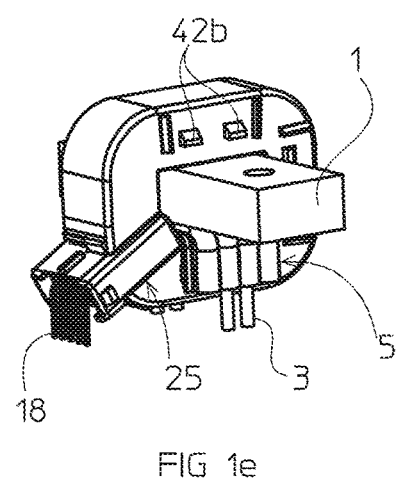

CURRENT TRANSDUCER

This application claims priority to PCT application number PCT/EP2015/055973 filed Mar. 20, 2015, which in turn claims priority from EP Patent application number EP 14161252.3 filed Mar. 24, 2014, the subject matter of which are incorporated herein by reference.

The present invention relates to an electric current transducer comprising a magnetic circuit surrounding a central aperture though which a primary conductor may extend for measuring an electric current in said primary conductor.

Electrical current transducer modules for current sensing applications typically comprise a magnetic core made of a high magnetic permeability material, surrounding a central aperture through which passes a primary conductor carrying the current to be measured. The magnetic core may typically have a generally rectangular or circular shape and, depending on the configuration, may be provided with an air-gap in which a magnetic field detector, such as a Hall effect sensor in the form of an ASIC, or a fluxgate sensor, is positioned. The magnetic flux generated by the electrical current flowing in the primary conductor is concentrated by the magnetic core and is representative of the primary current. In current sensors of the closed-loop type the magnetic field sensor is connected in a feed-back loop to a compensation coil, also generally called a secondary coil, that is typically wound around a portion of the magnetic core in order to generate a compensation current that tends to cancel the magnetic field generated by the primary conductor. The compensation current thus represents an image of the current to be measured. Secondary coils are also employed in current transducers of the open-loop type, but as pick-up coils that measure the magnetic field concentrated in the magnetic core in a transformer effect.

By reference to the generic term "current transducer" herein it is also meant to encompass current transformers, which may be considered to be a particular form of current transducer. An electric current transformer can be thought of as a closed-loop current transducer without electronics.

Electrical current sensors are used in a large variety of applications and devices for monitoring or controlling electrical devices and systems. In many applications there is an important advantage in reducing the manufacturing cost of such components and also the costs of implementing and using the components in an electrical circuit. There is often also an important advantage in providing compact components in order to miniaturize and/or reduce the weight of the devices in which the components are mounted.

In view of the various specific applications and devices for which a current transducer may be used, it is advantageous to provide versatile connection and mounting arrangements.

An object of the invention is to provide an electrical current transducer that is versatile and easy to install.

It is advantageous to provide an electrical current transducer that is economical to produce, install and use.

It is advantageous to provide an electrical current transducer that ensures accurate measurement and reliable operation.

It is advantageous to provide an electrical current transducer that is compact, robust and stable.

Objects of the invention have been achieved by providing a current transducer according to claim 1.

Objects of the invention have been achieved by providing a current transducer according to claim 4.

Objects of the invention have been achieved by providing a current transducer according to claim 13.

Dependent claims set forth various advantageous features of embodiments of the invention.

Disclosed herein is an electrical current transducer for measuring an electric current in a primary conductor, including a housing, a magnetic core surrounding a central aperture through which the primary conductor extends, and a magnetic field sensing device comprising connection terminals, the housing comprising a magnetic core receiving cavity in which the magnetic core is lodged and a connecting interface portion in which the magnetic field sensing is lodged.

In a first aspect of the invention, the connecting interface projects outwardly from the magnetic core receiving cavity and comprises latching elements complementary to latching elements of a separate connector interface element selectively mountable to the connecting interface portion. The connector interface element comprises a connector shroud forming with the connection terminals a pluggable connector interface for pluggable connection to an external pluggable connector. The current transducer can thus be adapted for mounting on an external circuit board without connector shroud, and adapted for removable pluggable connection to an external connector when the connector interface element is latched over the connecting interface portion of the housing.

In a second aspect of the invention, the transducer further comprises a conductor module comprising an insulating support in which U shaped conductor coil portions are lodged, the insulating support further comprising latching elements configured to engage complementary latching shoulders provided on the housing for securing the conductor module around a branch of the current transducer. The conductor mounting channels comprise clasp protrusions configured to clasp the U shaped conductor coil portions in the conductor mounting channels, a variable number of conductor coil portions being insertably mountable to the insulating support, the number selected according to the operating range of the current transducer.

In a third aspect of the invention, the transducer further comprising a support element that is separate from the housing, the support element comprising a base plate and extending transversely therefrom a pair of positioning walls spaced apart by distance corresponding essentially to a height between opposed lateral sides of the current transducer housing, configured to allow the current transducer housing to be inserted between the positioning walls of the support, whereby the positioning walls comprise latching elements configured to engage complementary latching elements provided on said lateral sides of the housing.

In an embodiment, the latching elements may be provided on opposite parallel branches of the conductor module and engage complementary latching elements provided on opposed lateral sides of the housing, the conductor module being configured for rotatable insertion through the central aperture and around a branch of the magnetic core.

In an embodiment, the connector shroud advantageously provides a shroud wall portion that surrounds and protects the connection terminals, the connector shroud further comprising an inner support wall portion with orifices configured to receive and guide the connection terminals of the magnetic field sensing device.

In an embodiment, the magnetic core may have a generally rectangular shape surrounding the central aperture and comprises a magnetic field circuit gap positioned in a corner region joining branches of the magnetic core.

In an embodiment, the magnetic circuit gap may be configured to receive therein a magnetic field detector of the magnetic field device at an angle (β) of between 20 and 45° with respect to one of said branches.

In an embodiment, the connection terminals have bent end portions configured for connection to circuit traces of a circuit board.

In an embodiment, the housing connecting interface portion advantageously comprises a polarizing element cooperable with a complementary polarizing element on the separate connector interface element.

In an embodiment, the housing may advantageously comprise a plurality of latching elements at a plurality of positions along branches of the transducer such that the support element may be fixed onto the housing at different positions.

In an embodiment, the support element advantageously comprises a width configured to allow the support to be inserted in the magnetic circuit aperture such that the base plate rests against an inner face of the magnetic circuit aperture.

In an embodiment, the support element may be employed to secure a primary conductor bar within the central aperture.

Further objects and advantageous features of the invention will be apparent from the claims, from the detailed description, and annexed drawings, in which:

FIGS. 1a-1e are perspective views of electrical current transducers according to different embodiments of the invention;

Figure 2A:
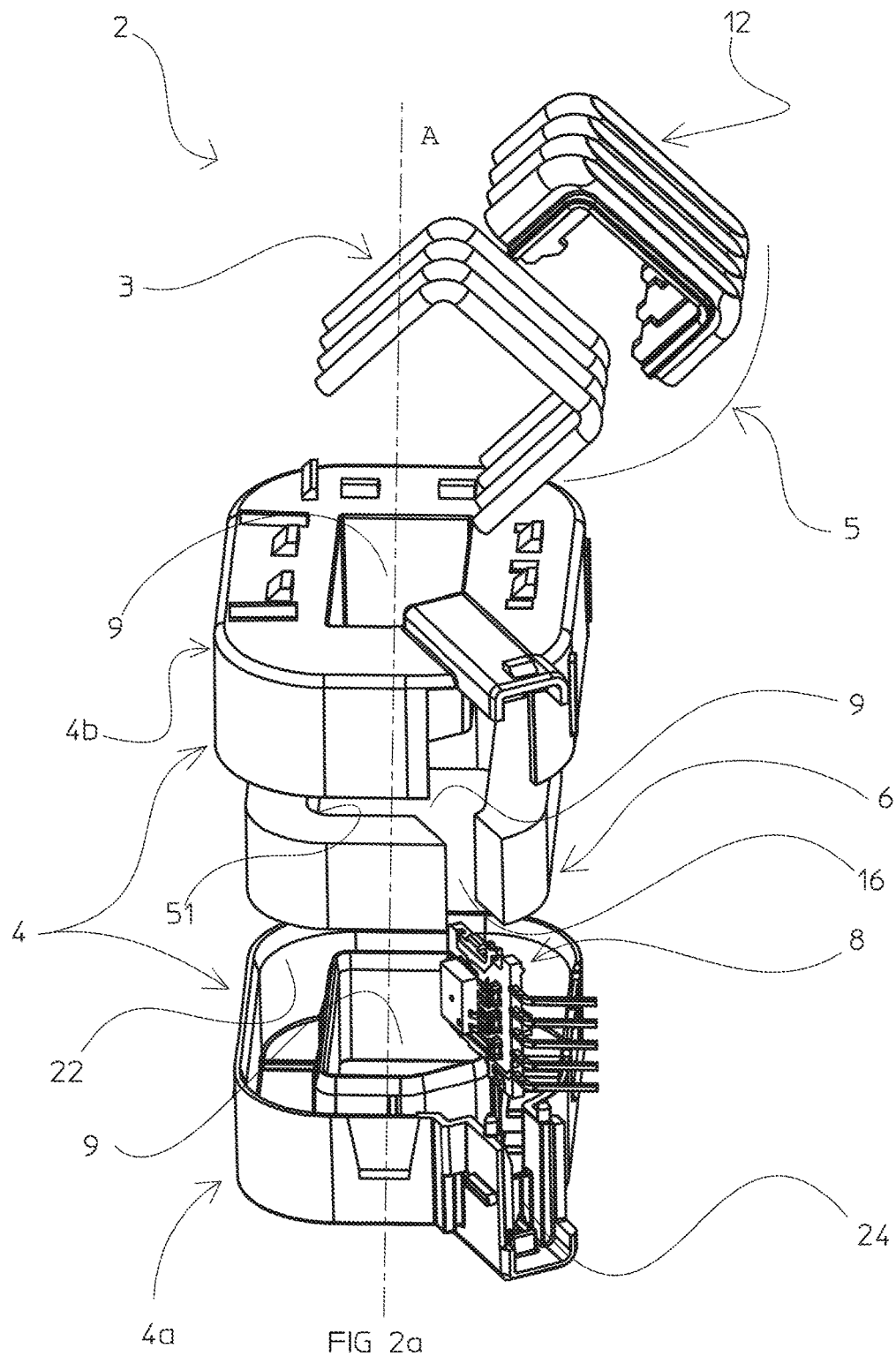
FIG. 2a is a perspective exploded view of an electrical current transducer according to an embodiment of the invention.
Figure 2B:
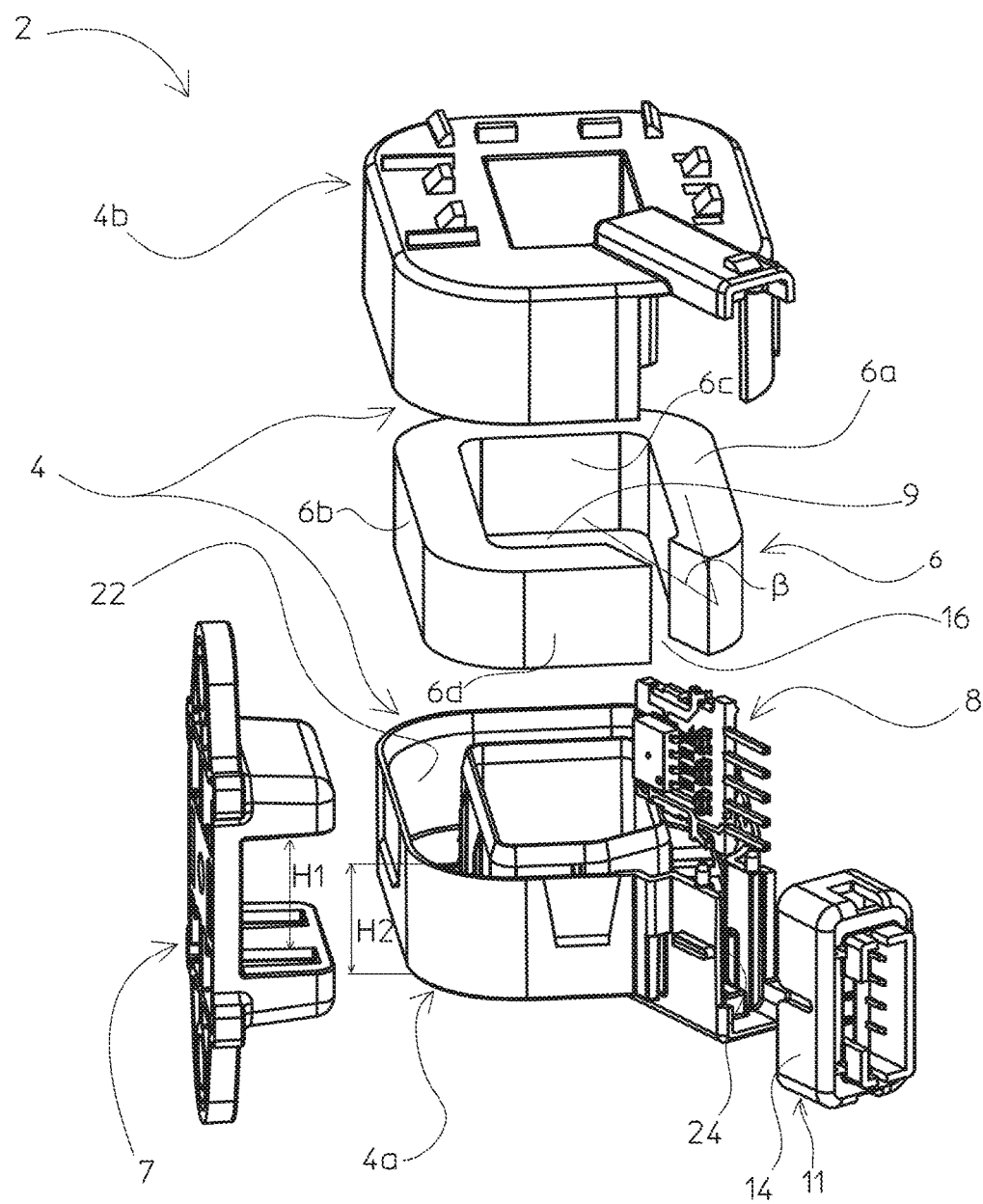
FIG. 2b is a perspective exploded view of an electrical current transducer according to another embodiment of the invention.

Referring to the figures, and more particularly to FIGS. 2a and 2b, an electrical current transducer 2 according to an embodiment of this invention comprises a housing 4, a magnetic core 6 mounted in the housing, and a magnetic field sensing device 8.

In a variant, the current transducer may be of an open-loop type and the magnetic field sensing device may comprise a magnetic flux density sensor such as a Hall element, that may be placed in a magnetic circuit gap 16 formed in the soft magnetic core 6.

In another variant, the current transducer may be of an open-loop type comprising a secondary winding acting as a pick-up coil that picks up the magnetic field signal circulating in the magnetic core generated by the current flowing in the primary conductor, to measure low frequency and DC currents.

In yet another variant, the transducer may be of a passive current transformer type with soft magnetic core 6 and current transformer coil around a branch or portion of the magnetic core.

In yet another variant, the current transducer may be of a closed-loop type and a secondary coil wound around a branch of the magnetic core acts a compensation coil driven to cancel the magnetic field signal circulating in the magnetic core generated by the current flowing in the primary conductor. In this variant, the magnetic field sensing device 8 that may be mounted in a magnetic circuit gap 16 of the magnetic core 6. The operation principle of a closed-loop type of current transducer is per se well known in the art, whereby a magnetic field generated by a primary conductor carrying a current to be measured is picked up by the magnetic field sensing device 8, the signal of the magnetic field sensing device being processed to generate an electrical current in the secondary coil that seeks to produce an opposing magnetic field cancelling the magnetic field generated by the primary conductor. The electrical current needed to drive the secondary coil to cancel the magnetic field in the magnetic core thus represents an image of the primary current (i.e. is proportional to the primary current to be measured).

The electrical current transducer may further comprise a signal processing circuit formed on a circuit board mounted in the housing or outside of the housing, on which the current transducer is mounted.

The current transducer may either comprise an electrical connector or an electrical connection lead or cable for connection to external circuitry that receives the measurement signal and, depending on the variant, supplies power to the electrical current transducer.

The soft magnetic core may be made of a ferrite, or laminated soft iron or other materials with a high magnetic permeability and low coercive force.

The current transducer 2 comprises a magnetic circuit aperture 9 passing through the center of the transducer and configured to allow current conductors 1, 3 to extend therethrough. At least one of the current conductors is intended to carry a primary current to be measured. The current conductors may, depending on the variant, comprise a secondary current conductor for carrying a secondary current that may be a compensation current configured to cancel the magnetic field generated by the primary conductor, in a closed-loop sensor configuration. The secondary conductor may also form part of a pick up coil to measure high frequency currents in a transformer effect. The current conductors may further comprise two primary conductor portions for measuring a differential current.

In a variant, the current conductors may comprise a primary conductor bar 1 extending through the magnetic circuit aperture so as to present connection ends for connection to an external conductor carrying the current to be measured.

In certain embodiments, the electrical current transducer may be provided without primary conductor portions pre-installed to the transducer, the conductor carrying the current to be measured being inserted through the magnetic circuit aperture 9 at the site of operation.

The current conductors may also, in certain embodiments, comprise conductor coil portions 3 mounted around a branch of the magnetic core 6 and extending through the magnetic circuit aperture 9, the conductor coil portions 3 having a general U shape.

The conductor coil portions 3 may advantageously form part of a conductor module 5 comprising an insulating support 12 with conductor mounting channels 26 in which the conductor coil portions 3 are lodged. The conductor mounting channels 26 may be provided with clasps or pinch protrusions 27 configured to clasp the U shaped conductor coil portions 3 in the conductor mounting channels 26. The preformed conductor mounting channels with clasp protrusions enable a chosen amount of U shaped conductor coil portions 3, from one to a plurality occupying all available positions, to be assembled in the insulating support. This allows the number of windings around the magnetic core to be easily configured without needing to modify or redesign the insulating support 12 nor the housing 4. The insulating support 12 further comprises latching elements 28a with latching protrusions or shoulders 29 configured to engage complementary latching shoulders 28b provided on the housing 4 for securing the conductor module around a branch of the current transducer. In a variant it is however also possible to provide a conductor module in which the conductor coil portions are overmolded by the insulating support.

Figure 7A:
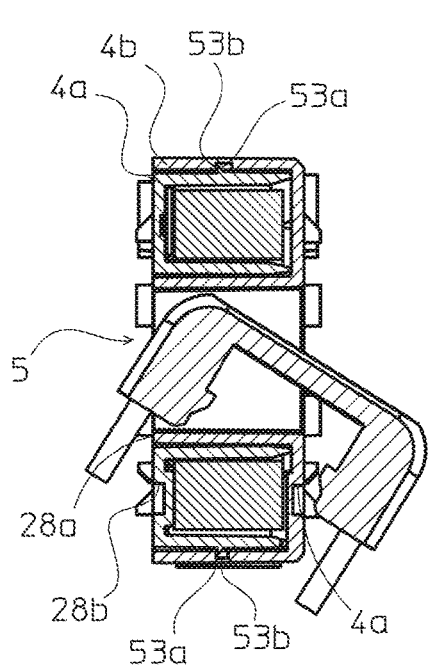
FIGS. 7a, 7b are cross section views of the conductor module being mounted in the central aperture.
Figure 7B:
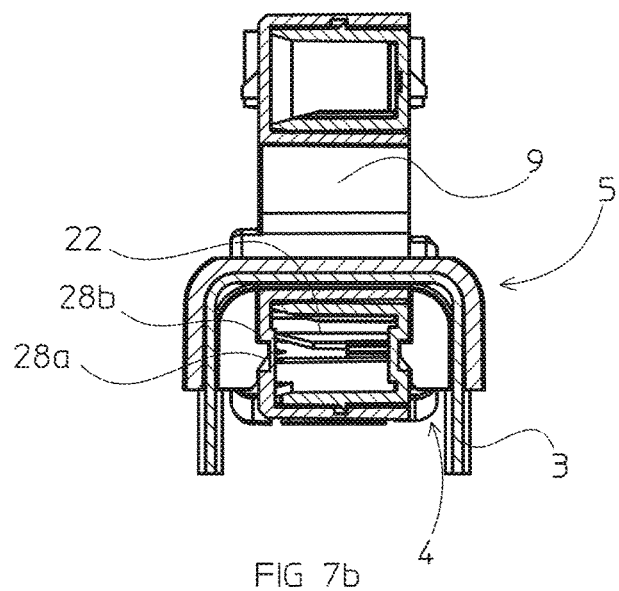
Figure 8:
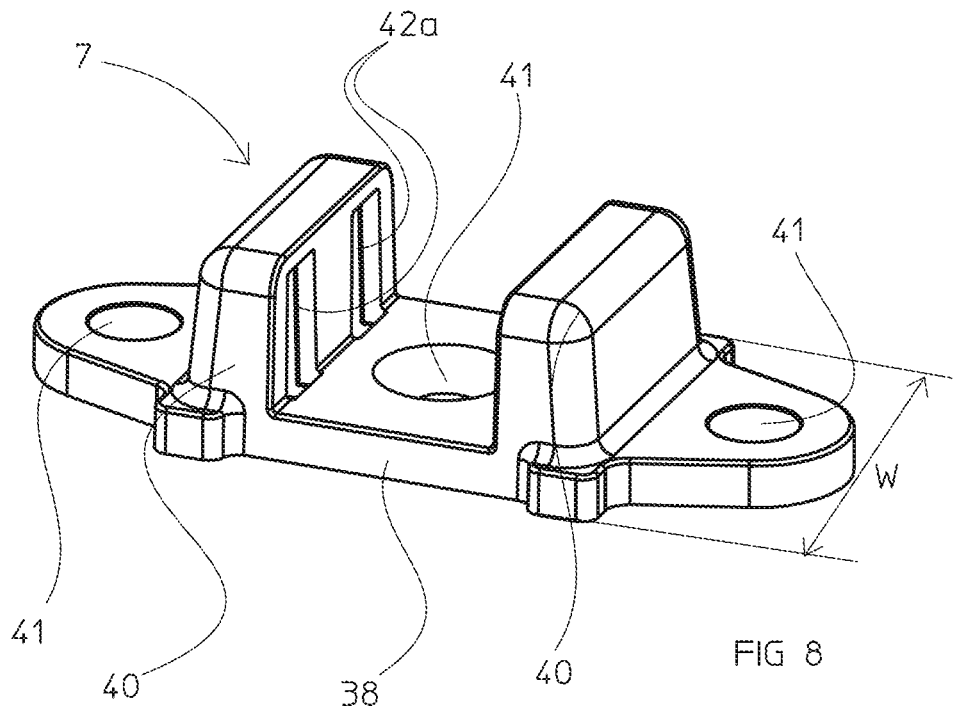
FIG. 8 is a perspective view of a support element of a current transducer according to an embodiment of the invention.

As best seen in FIGS. 7a and 7b, an end of the U shaped conductor coil portions of the conductor module 5 may be inserted through the magnetic circuit aperture 9 and the module 5 is rotated around and clipped onto the housing 4. The latching elements 28a are provided on opposite parallel branches of the conductor module 5 and engaging complementary latching elements 28b provided on opposed lateral sides of the housing.

The housing 4 may be provided with latching elements 28b on any of the branches of the transducer, or on a plurality of branches such that the conductor module 5 may be clipped around different branches of the transducer.

In a variant (not shown) a plurality of conductor modules may be clipped to the current transducer. For instance, a conductor module 5 may be clipped to opposed parallel branches of the current transducer. This allows to provide a plurality of coils installed around the magnetic circuit of the current transducer. For instance one coil can serve as a secondary coil and the other as the primary coil, or both coils carry primary conductors in a differential current measurement arrangement, or both coils can be parts of the same primary current conductor, the additional coils intended to increase for instance the sensitivity of the current measurement.

An advantage of the separately mountable conductor module 5 around a branch of the current transducer is that the transducer can be provided with or without conductor coil portions 3, depending on the application, and moreover the number of conductor coil portions can be easily modified by installing in the conductor mounting channels 26 the desired number of conductor coil portions 3 in order to change the measurement range of the current transducer in a simple and cost effective manner. Also, different conductor modules may be provided, for instance with a greater number of conductor channels, without requiring any redesign or modification of the electric current transducer housing. Also as may be seen in figures 1a to 1e showing different variants of an electrical current transducer according to the invention, the transducer can:

be supplied without current conductors extending through the magnetic circuit aperture 9 (FIGS. 1a, 1b), or the current transducer may be supplied with a pre-assembled primary conductor bar 1 extending through the magnetic circuit aperture 9 and fixed to the transducer by means of a support element 7 (see FIG. 1c), or the conductor module 5 may be pre-assembled to the current transducer housing (FIG. 1d), or both a conductor bar 1 and a conductor module 5 may be pre-assembled with the current transducer housing (FIG. 1e), or the current transducer may be provided with two or more pre-installed conductor modules (not shown).

Figure 9:
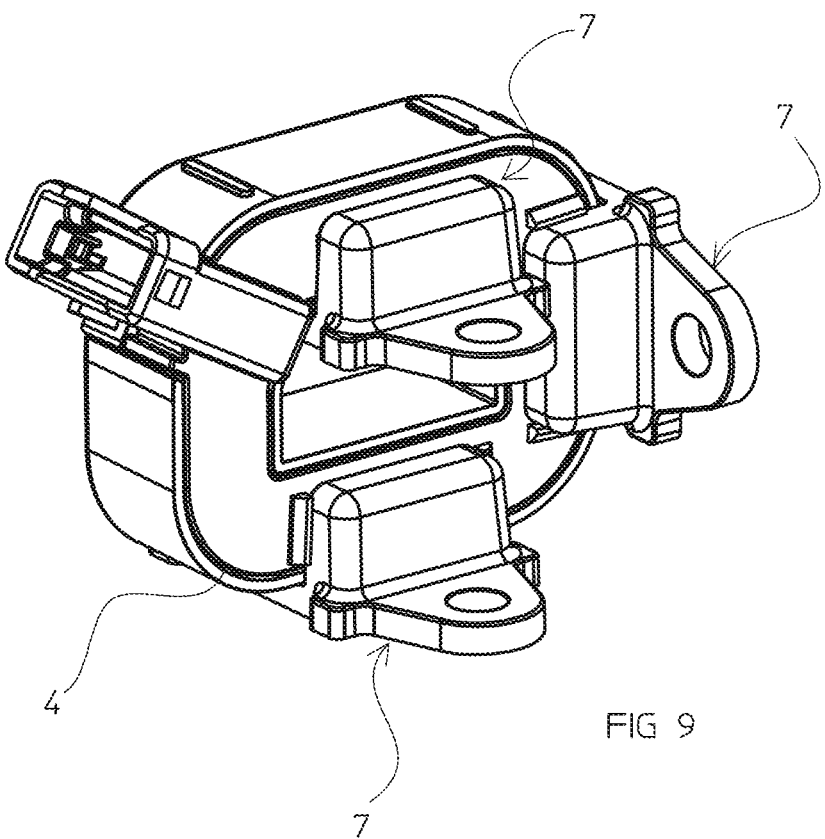
FIG. 9 is a perspective view of a current transducer according to an embodiment of the invention illustrating the support element in different possible assembly positions.
Figure 10A:
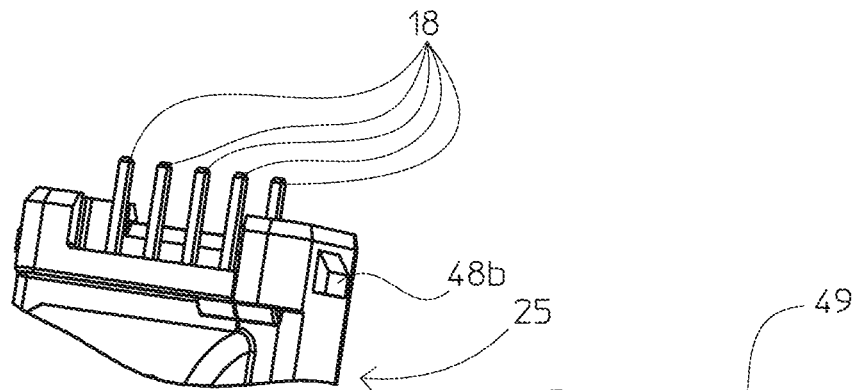
FIG. 10a is a perspective view of a connection interface portion of a current transducer according to an embodiment of the invention.
Figure 10B:
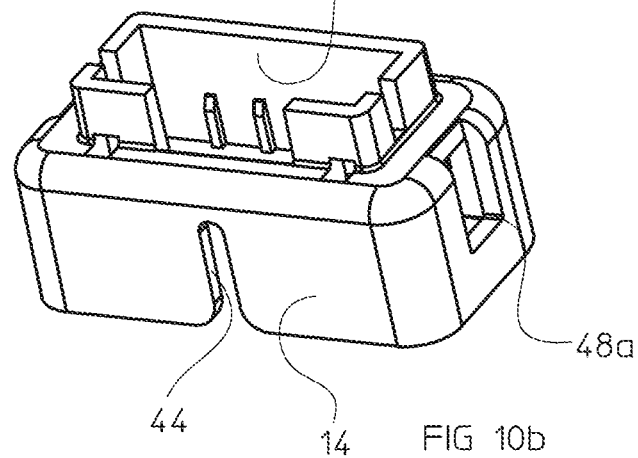
FIG. 10b is a perspective view of a connection interface portion shroud of a current transducer according to an embodiment of the invention.
Figure 10C:
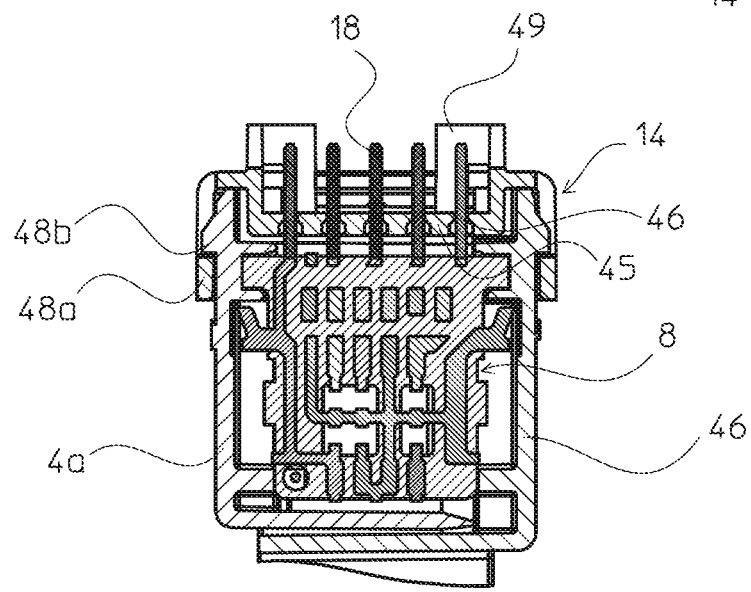
FIG. 10c is a cross section view of a connection interface portion of a current transducer according to an embodiment of the invention.

The current transducer may further comprise a support element 7 that is separate and separable from the housing 4, the support element comprising a base plate 38 and extending transversely therefrom a pair of positioning elements or walls 40 spaced apart by distance H1 corresponding essentially to a height H2 between opposed lateral sides of the current transducer housing 4. This allows the current transducer housing to be inserted between the positioning walls 40 of the support, whereby the positioning walls may be provided with fixing or latching elements 42a configured to engage complementary fixing or latching elements 42b provided on the lateral walls of the housing 4. The latching elements 42b on the housing may be provided at various positions along any or each of the branches of the transducer such that the support element 7 may be fixed onto the housing at different positions as illustrated in FIG. 9. By way of example, as shown in FIG. 1a, the support element 7 is mounted on one of the long branches of the transducer housing and in FIG. 1b on one of the short branches such that the transducer can be mounted on an external support or within a device in various orientations.

The support element 7 may advantageously be provided with a width W that is configured to allow the support to be inserted in the magnetic circuit aperture 9 such that the base plate 38 rests against an inner face of the magnetic circuit aperture. In this configuration the support element 7 may for instance be employed to secure the primary conductor, in particular the primary conductor bar 1, within the central aperture as illustrated in FIG. 1c. It may be noted however that instead of supporting a central conductor bar, the support element 7 may also be configured to fix the transducer to a support element in the form of a bar extending through the central aperture.

The support element 7 may be provided with a variety of fixing interfaces for mounting the current transducer to an external support or for fixedly assembling the conductor bar 1 in the central aperture 9. In the embodiment illustrated, the fixing means is in a form of an orifice or a plurality of orifices 41 to receive a bolt, screw or rivet therethrough. The skilled person understands that many other fixing means per se well known in the art may be integrated in the base plate 38 for fixing the support 7 to an external device.

Referring now to FIGS. 2a to 5b, in the illustrated embodiments, the magnetic core 6 is provided with a magnetic circuit gap 16 (also commonly known as an "airgap") in which the magnetic field sensing device 8 is inserted.

In the illustrated embodiment the magnetic field sensing device comprises a magnetic field detector 10 which may for instance be a Hall effect sensor in an ASIC (Application Specific Integrated Circuit), connected to connection terminals 18, the magnetic field detector and connection terminals being supported by a dielectric support body 20. There may be other circuit components 21 mounted on the dielectric support body and connected to or between the magnetic field detector and connection terminals. These circuit components may for instance be capacitors, inductances or resistors, for instance that may be used as filters for pre-processing of the measurement signal. The connection terminals 18 may be of various configurations, and in the illustrated example the connection terminals form part of a stamped and formed lead frame 30 that is overmolded by the dielectric support body 20. The dielectric support body may comprise lateral positioning elements 30a that engage in complementary positioning elements 30b provided in the housing 4 to securely position and anchor the magnetic field sensing device within the housing. The anchoring elements ensure that connection forces applied on the terminals 18, for instance during mounting of the transducer on an external circuit board or during coupling of an external pluggable connector to the current transducer are supported by the magnetic field sensing device while allowing a certain amount of give to prevent permanent deformation or rupture and also to allow thermal dilatation between the housing components. The complementary positioning elements 30a, 30b also ensure that the magnetic field detector 10 is accurately positioned within the magnetic field circuit gap 16.

Referring to FIGS. 2a, 2b, FIGS. 5a, 5b and FIGS. 10a to 10c two different embodiments of a connection interface between the magnetic field sensing device 8 and an external circuit (not shown) are illustrated. In the embodiment of FIG. 2a and FIGS. 4a, 5a, 5b, the connection terminals 18 of the magnetic field sensing device are intended for connection, in particular solder connection, to an external circuit board (not shown). In the embodiment illustrated the connection terminals are in the form of pin terminals. In a first embodiment the pin terminals have bent end portions 34 for insertion through plated through holes of a printed circuit board. The bent end portions 34 could however have other configurations, for instance adapted for surface mount solder connection to circuit traces on a circuit board. Surface mount and plated through-hole type of circuit board connections are per se well known in the art.

The embodiment for mounting on and connection to an external circuit board is well adapted for a transducer configuration comprising conductor coil portions 3 presenting connection ends also configured for mounting on a circuit board, as shown in FIGS. 1d, 1e. The connection ends of the illustrated conductor coil portions 3 are in the form of pin terminals, however may also be provided with surface mount connection ends.

Figure 3:
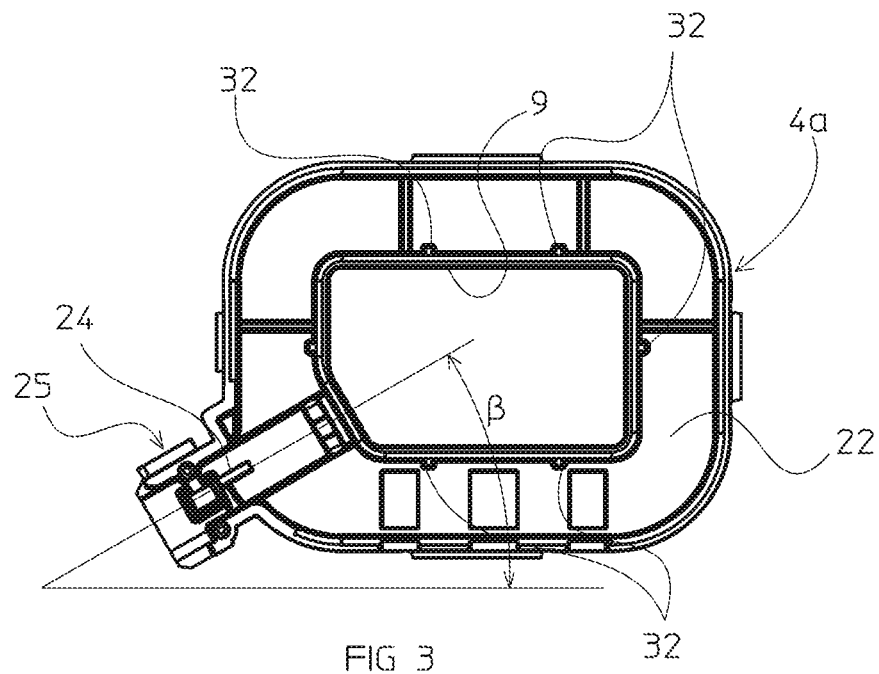
FIG. 3 is a view of a housing part of an electrical current transducer according to an embodiment of this invention.
Figure 4A:
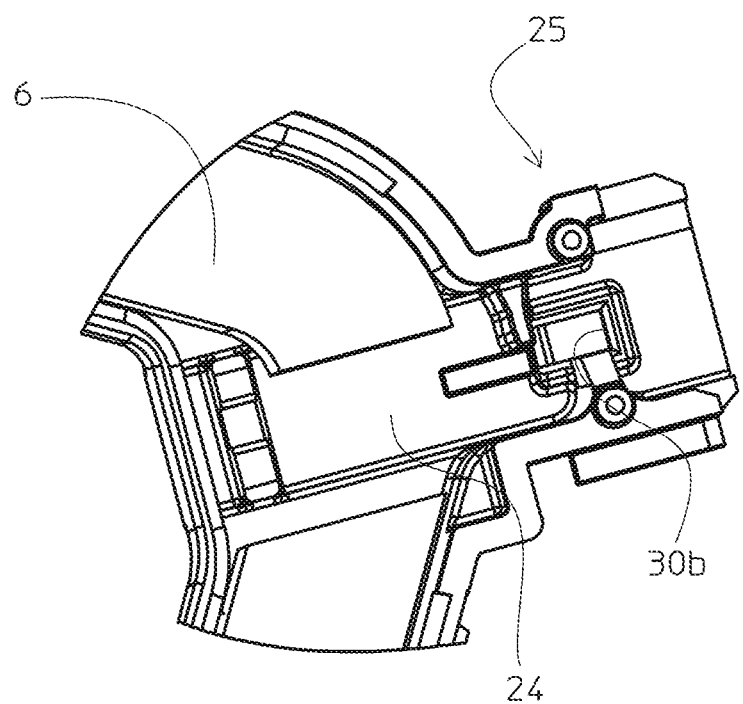
FIG. 4a is a view of a portion of the housing part illustrated in FIG. 3 and a portion of a magnetic circuit mounted in the housing part.
Figure 4B:
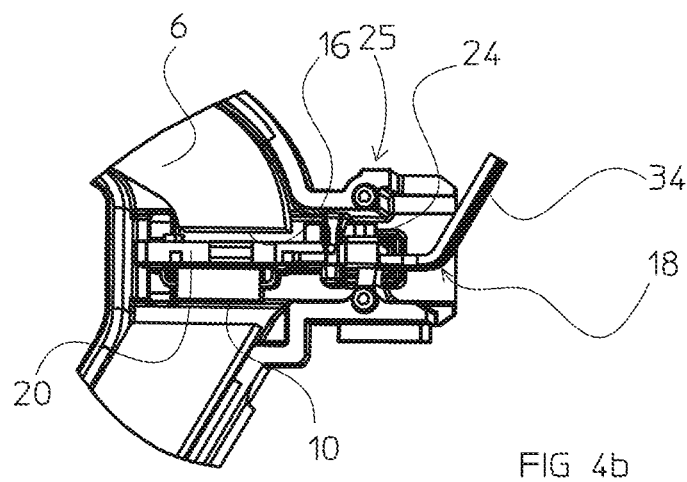
FIG. 4b is a view similar to FIG. 4a but with a magnetic field sensing device mounted in the housing part.
Figure 5A:
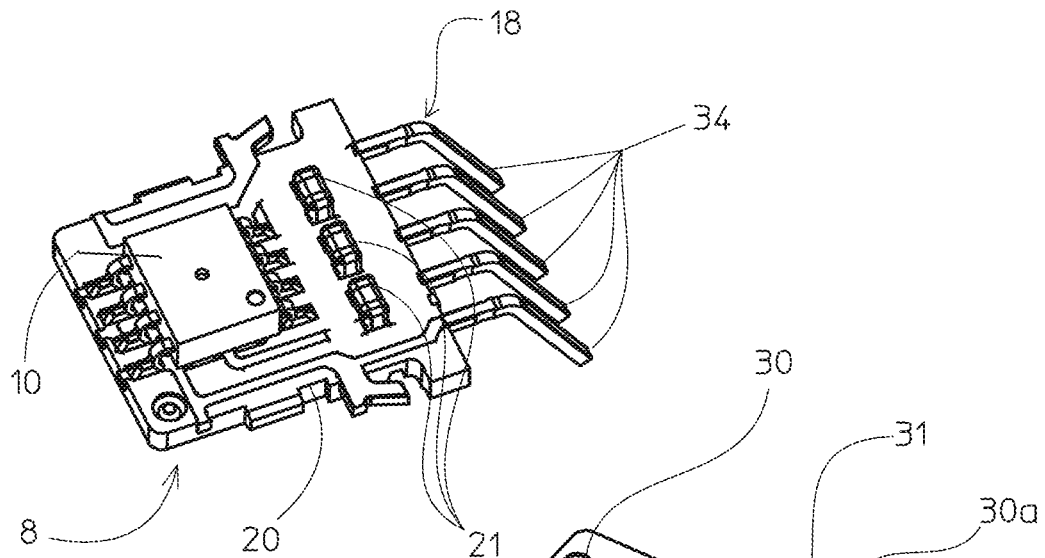
FIGS. 5a, 5b are perspective views of the magnetic field sensing device according to an embodiment of the invention.
Figure 5B:
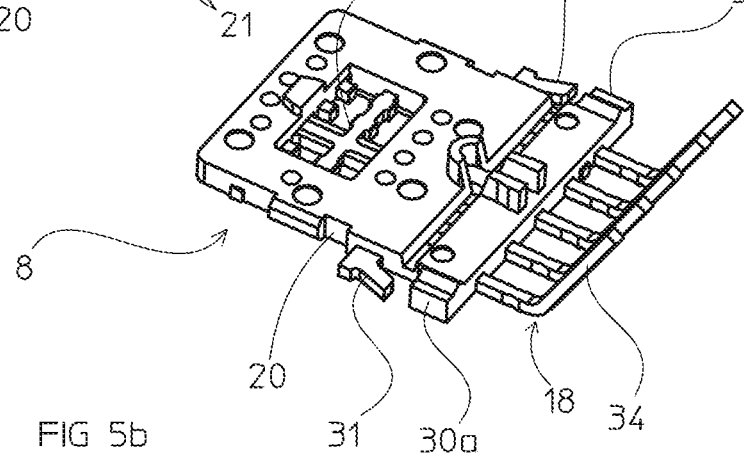
Figure 6A:
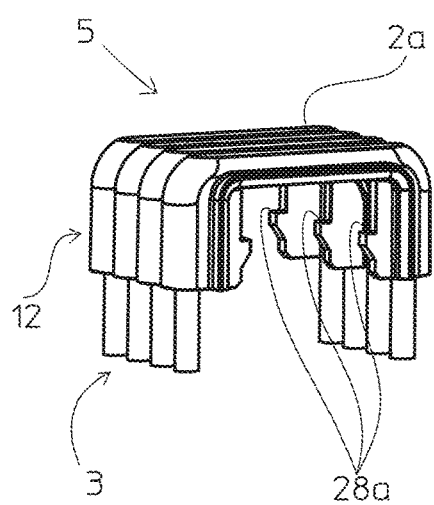
FIGS. 6a, 6b are perspective views of a conductor module, in particular a primary conductor module, mountable in a central aperture of a current transducer according to an embodiment of the invention.
Figure 6B:
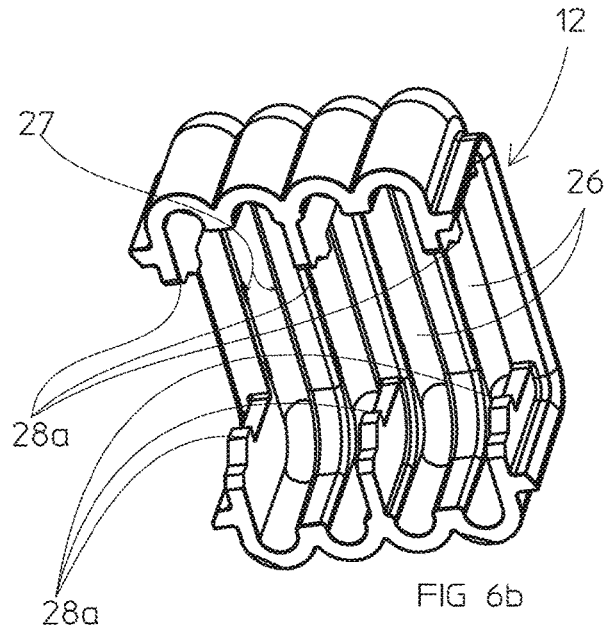

In an electric current transducer variant for connection to an external circuit board, the magnetic core 6 advantageously comprise a magnetic field circuit gap 16 position in a corner region joining branches 6a, 6b of the magnetic core. In the illustrated embodiment, the magnetic core has a generally rectangular shape with opposed first and second branches 6a, 6b that are longer than opposed third and fourth branches 6c, 6d. In this specific exemplary configuration, the magnetic circuit gap 16 may be provided at an angle β with respect to the first branch 6a, thus allowing the magnetic field sensing device 8 to be oriented at an angle β of between 20 and 40° with respect to the first branch 6a around which the conductor coil portions 3 are mounted. In this specific example this angle β may for instance be around 30° as illustrated in FIG. 3. This configuration allows the bent end portions 34 of the connection terminals 18 from being spaced as far as possible from primary conductor coil portions 3 thus providing a large electrical creepage distance between the primary conductors and terminals of the magnetic field sensing device 8. Also, the bent configuration of the end portions of the connection terminals 18 provide a certain flexibility allowing some displacement in the plane of the external circuit board, for instance to absorb some thermal dilatation differences between the electric current transducer and the circuit board and also to allow for easier assembly and connection of the current transducer to the circuit board.

In a second embodiment, as best illustrated in FIGS. 2b and FIGS. 10a to 10c, the connection terminals 18 of the magnetic field sensing device may be configured for removably pluggable connection to an external connector of a signal processing or control device (not shown). In the embodiment illustrated, the connection terminals 18 are in the form of pin terminals, but they could also have other shapes per se known in the art for use as terminals in a pluggable connector. In this embodiment, the current transducer 2 may be further provided with a connector interface element 11 comprising a connector shroud 14 configured for assembly on a connecting interface portion 25 of the housing 4. The separately mountable connector shroud 14 allows the current transducer to be easily adapted either for pluggable connection of for circuit board mounting without having to redesign or modify the housing 4.

The connector shroud 14 advantageously provides a specific connection interface adapted for connection to a complementary external connector and also provides a shroud wall portion 49 that surrounds and thus protects the connection terminals 18. The connector shroud may further comprise an inner support wall portion 45 with orifices 46 configured to receive and guide the connection terminals 18. This provides a more rigid structure for supporting the connection terminal pins better adapted for pluggable connection, whereas for a circuit board connection the absence of the support wall portion 45 allows greater flexibility that improves reliability of the connection between the terminals and circuit board. The connector shroud 14 may be provided with a polarizing element 44, for example in the form of a slot, that cooperates with the complementary polarizing element, for example in the form of a rib or protrusion, on the housing that ensures that the shroud is mounted in the correct orientation over the housing connector interface portion 25. Complementary latching or fixing elements 48a, 48b on the connector shroud and on the housing may be provided to lock the shroud to the housing during assembly.

Referring now to FIGS. 2a, 2b and 3, the housing 4 is, in an advantageous embodiment, provided as a first housing part 4a and a second housing part 4b that may be fixed together after assembly of the magnetic core and the magnetic field sensing device therein, the assembly of the magnetic core and the magnetic field sensing device as well as the housing parts all being performed in an axial direction A for cost effective and easy assembly. The first housing part 4a comprises a core receiving cavity 22 and a sensing device receiving cavity 24. The sensing device receiving cavity may advantageously be positioned in a corner joining two branches of the housing. The core receiving cavity 22 may be provided with positioning protrusions 32 in the form of axially directed ribs that provide a slight interference fit with the inner face 51 of the magnetic core to ensure a play-free securing of the magnetic core within the housing during assembly.

The second housing part 4b is provided with a complementary cavity that receives the first housing part 4b with the assembled magnetic core 6 and magnetic field sensing device 8 therein. Complementary latches 53a, 53b on the first and second housing parts 4a, 4b allow the housing parts to be securely clipped together during assembly. Other fixing means between housing parts may also be employed in addition or as an alternative to the clipping means, for example ultrasonic welding, bonding with an adhesive, or by providing a mechanical clamp around the housing parts, or even by screwing or riveting two parts together.

A potting material may be filled within the cavity 22 of the first housing part after assembly of the magnetic field sensing device 8 and magnetic core 6, or no potting material may be provided, depending on the variant and on the application.

The connector interface portion 25 of the housing receiving the sensing device may advantageously project beyond the general periphery of the housing formed by the adjoining orthogonal branches of the housing. This advantageously allows, on the one hand a connector interface element to be plugged or mounted over the projecting connector interface portion 25, and on the other hand extends the connection terminals 18 of the magnetic field sensing device 8 to the surface of an external circuit board whilst increasing creepage distance between the primary conductor and the sensing device terminals.

List of references used in the drawings electric current transducer 2
    current conductors extending through magnetic circuit aperture 1, 3
        primary conductor bar 1
        conductor coil portions 3 (primary and/or secondary)
    primary conductor
        primary conductor bar 1 (according to variant)
        conductor coil portions 3 (according to variant)
    secondary coil (according to variant)
        conductor coil portions 3
    conductor module 5
        insulating support 12
            conductor mounting channels 26
                pinch protrusions
            latching elements 28
                latching protusions/shoulders
        conductor coil portions 3 (primary and/or secondary depending on variant)
    housing 4
        first housing part 4a
            fixing (latching) elements 53a
            core receiving cavity 22
                positioning protrusions 32
                      → ribs
            sensing device receiving cavity 24
        second housing part 4b
            fixing (latching) elements 53b
        conductor module latching elements 28b
        support element latching elements 42b
        connector interface portion 25
            fixing (latching) elements 48b
    support element 7
        base plate 38
            fixing means (e.g. screw holes)
        positioning/walls 40
            fixing (latching) elements 42a
    connector interface element 11
        connector shroud 14
            shroud wall portion 49
            polarizing element 44
            connection terminal guide wall 45

-continued

List of references used in the drawings connection terminal guide orifices 46
                fixing (latching) elements 48a
    magnetic core 6
        first branch 6a
        second branch 6b
        third branch 6c
        fourth branch 6d
        inner face 51
        magnetic circuit gap 16
    magnetic circuit aperture 9
    magnetic field sensing device 8
        magnetic field detector 10
            ASIC → Hall effect sensor
        lead frame (stamped and formed) 30
            anchoring element 31
        connection terminals 18
            pin terminals
                bent end portions 34 (for circuit board connection) (variant)
        dielectric support body 20 → overmolded
            positioning element 30
        circuit components 21
            → e.g. capacitors, inductances, resistors
circuit board (not shown) (some variants)

The invention claimed is:

1. Electrical current transducer for measuring an electric current in a primary conductor, including a housing, a substantially rectangular magnetic core surrounding a substantially rectangular central aperture through which the primary conductor extends, and a magnetic field sensing device comprising connection terminals, the housing comprising a magnetic core receiving cavity in which the magnetic core is lodged and a connecting interface portion in which the magnetic field sensing is lodged, the connecting interface projecting outwardly from the magnetic core receiving cavity, said connecting interface comprising first latching elements complementary to second latching elements of a separate connector interface element selectively mountable to the connecting interface portion, the separate connector interface element comprising a connector shroud forming with the connection terminals a pluggable connector interface for pluggable connection to an external pluggable connector, said connection terminals configured for mounting on an external circuit board without said selectively mountable connector shroud.

2. Electrical current transducer according to claim 1, further comprising a conductor module comprising an insulating support in which U shaped conductor coil portions are lodged, the insulating support further comprising third latching elements configured to engage complementary latching shoulders provided on the housing for securing the conductor module around a branch of the current transducer.

3. Electrical current transducer according to claim 2, wherein the insulating support comprises conductor mounting channels comprising clasp protrusions configured to clasp the U shaped conductor coil portions in the conductor mounting channels, a variable number of conductor coil portions being insertably mountable to the insulating support, the number selected according to the operating range of the current transducer.

4. Electrical current transducer according to claim 1, wherein the connector shroud provides a shroud wall portion that surrounds and protects the connection terminals, the connector shroud further comprising an inner support wall portion with orifices configured to receive and guide the connection terminals.

5. Electrical current transducer according to claim 2, wherein the third latching elements of the conductor module are provided on opposite parallel branches of the conductor module and engaging complementary fourth latching elements provided on opposed lateral sides of the housing, the conductor module being configured for rotatable insertion through the central aperture and around a branch of the magnetic core.

6. Electrical current transducer according to claim 1, wherein the magnetic core has a generally rectangular shape surrounding the central aperture and comprises a magnetic field circuit gap positioned in a corner region joining branches of the magnetic core.

7. Electrical current transducer according to claim 6, wherein the connector shroud protrudes outwardly from said corner region at an angle ($\beta$) of between 20 and 45° with respect to one of said branches.

8. Electrical current transducer according to claim 1, wherein the magnetic circuit gap is configured to receive therein a magnetic field detector of the magnetic field device at an angle ($\beta$) of between 20 and 45° with respect to one of said branches.

9. Electrical current transducer according to claim 8, wherein the connection terminals have bent end portions configured for connection to circuit traces of a circuit board.

10. Electrical current transducer according to claim 1, wherein the housing connecting interface portion comprises a polarizing element cooperable with a complimentary polarizing element on the separate connector interface element.

11. Electrical current transducer according to claim 1, further comprising a support element that is separate from the housing, the support element comprising a base plate and extending transversely therefrom a pair of positioning walls spaced apart by distance (H1) corresponding essentially to a height (H2) between opposed lateral sides of the current transducer housing, configured to allow the current transducer housing to be inserted between the positioning walls of the support, whereby the positioning walls comprise fifth latching elements configured to engage complementary sixth latching elements provided on said lateral sides of the housing, wherein the housing comprises a plurality of said sixth latching elements at a plurality of positions along branches of the transducer such that the support element may be fixed onto the housing at different positions.

12. Electrical current transducer for measuring an electric current in a primary conductor, including a housing, a magnetic core surrounding a central aperture through which the primary conductor extends, and a magnetic field sensing device comprising connection terminals, the housing comprising a magnetic core receiving cavity in which the magnetic core is lodged and a connecting interface portion in which the magnetic field sensing is lodged, the transducer further comprising a conductor module comprising an insulating support in which U shaped conductor coil portions are lodged, the insulating support further comprising latching elements configured to engage complementary latching shoulders provided on the housing for securing the conductor module around a branch of the current transducer, wherein the conductor mounting channels comprise clasp protrusions configured to clasp the U shaped conductor coil portions in the conductor mounting channels, a variable number of conductor coil portions being insertably mountable to the insulating support, the number selected according to the operating range of the current transducer and, further comprising a support element that is separate from the housing, the support element comprising a base plate and extending transversely therefrom a pair of positioning walls spaced apart by distance (H1) corresponding essentially to a height (H2) between opposed lateral sides of the current transducer housing, configured to allow the current transducer housing to be inserted between the positioning walls of the support, whereby the positioning walls comprise latching elements configured to engage complementary latching elements provided on said lateral sides of the housing, wherein the housing comprises a plurality of said latching elements at a plurality of positions along branches of the transducer such that the support element may be fixed onto the housing at different positions.

13. Electrical current transducer for measuring an electric current in a primary conductor, including a housing, a magnetic core surrounding a central aperture through which the primary conductor extends, and a magnetic field sensing device comprising connection terminals, the housing comprising a magnetic core receiving cavity in which the magnetic core is lodged and a connecting interface portion in which the magnetic field sensing is lodged, the transducer further comprising a support element that is separate from the housing, the support element comprising a base plate and extending transversely therefrom a pair of positioning walls (40) spaced apart by distance (H1) corresponding essentially to a height (H2) between opposed lateral sides of the current transducer housing, configured to allow the current transducer housing to be inserted between the positioning walls of the support, whereby the positioning walls comprise latching elements configured to engage complementary latching elements provided on said lateral sides of the housing, the housing comprising a plurality of said latching elements at a plurality of positions along branches of the transducer such that the support element may be fixed onto the housing at different positions.

14. Electrical current transducer according to claim 13, wherein the support element comprises a width (W) configured to allow the support to be inserted in the magnetic circuit aperture such that the base plate rests against an inner face of the magnetic circuit aperture.

15. Electrical current transducer according to claim 13, further comprising an integrated conductor bar extending through the central aperture.

16. Electrical current transducer according to claim 15, wherein the support element is employed to secure the primary conductor bar within the central aperture.

* * * * *